(12) United States Patent
Shell et al.

(10) Patent No.: US 7,639,026 B2
(45) Date of Patent: Dec. 29, 2009

(54) ELECTRONIC DEVICE TEST SET AND CONTACT USED THEREIN

(75) Inventors: Dennis B. Shell, Webster, MN (US); Mathew L. Gilk, Lakeville, MN (US); Jose E. Lopez, Sunnyvale, CA (US)

(73) Assignee: Johnstech International Corporation, Minneapolis, MN (US)

( * ) Notice: Subject to any disclaimer, the term of this patent is extended or adjusted under 35 U.S.C. 154(b) by 0 days.

(21) Appl. No.: 11/677,870

(22) Filed: Feb. 22, 2007

(65) Prior Publication Data

US 2007/0236236 A1    Oct. 11, 2007

Related U.S. Application Data

(60) Provisional application No. 60/776,654, filed on Feb. 24, 2006.

(51) Int. Cl.
*G01R 31/02* (2006.01)
*H01R 11/18* (2006.01)

(52) U.S. Cl. ............... 324/754; 324/757; 324/761; 439/73; 439/482

(58) Field of Classification Search ......... 324/754–765, 324/73, 482; 439/59–62, 66, 264
See application file for complete search history.

(56) References Cited

U.S. PATENT DOCUMENTS

| 4,321,122 | A | * | 3/1982 | Whitcomb et al. | 204/400 |
|---|---|---|---|---|---|
| 5,207,584 | A | * | 5/1993 | Johnson | 439/66 |
| 5,594,355 | A | * | 1/1997 | Ludwig | 324/755 |
| 5,634,801 | A | * | 6/1997 | Johnson | 439/71 |
| 5,781,022 | A | * | 7/1998 | Wood et al. | 324/757 |
| 2002/0045365 | A1 | | 4/2002 | Lee | |
| 2004/0217771 | A1 | * | 11/2004 | Leong | 324/754 |
| 2004/0248448 | A1 | * | 12/2004 | Gilk | 439/264 |

FOREIGN PATENT DOCUMENTS

EP    1 482 595 A    12/2004

* cited by examiner

*Primary Examiner*—Ha Tran T Nguyen
*Assistant Examiner*—Emily Y Chan
(74) *Attorney, Agent, or Firm*—Nawrocki, Rooney & Sivertson, P.A.

(57) ABSTRACT

A contact for use in a test set which can be mounted to a load board of a tester apparatus. The contact, which serves to electrically connect at least one lead of a device being tested with a corresponding metallic trace on the load board, has a first end defining multiple contact points. As the contact is rotated about an axis generally perpendicular to a plane defined by the contact, successive contact points are sequentially engaged by a lead of the device being tested.

3 Claims, 3 Drawing Sheets

ELECTRONIC DEVICE TEST SET AND CONTACT USED THEREIN

CROSS-REFERENCE TO RELATED APPLICATIONS

This is a regular application filed under 35 U.S.C. § 111(a) claiming priority, under 35 U.S.C. § 119(e)(1), of provisional application Ser. No. 60/776,654, previously filed Feb. 24, 2006 under 35 U.S.C. § 111(b).

TECHNICAL FIELD

The present invention relates broadly to the field of testing of electronic devices such as integrated circuits. More narrowly, however, the invention deals with test sets for interfacing pads or leads of a device to be tested with corresponding pads of a circuit board of a test apparatus. A specific embodiment of the invention focuses upon the construction and mounting of a contact of the test set.

BACKGROUND OF THE INVENTION

The testing of integrated circuit devices is performed to ensure that such devices, when sold to a customer, are of as high a degree of quality as possible. Various types of test apparatus have been utilized over the years to accomplish testing. Typically, a tester includes a printed circuit board which has defined thereon a plurality of conductive traces. These traces on the circuit board, or load board, are associated with corresponding functions of the test apparatus.

In order to accomplish testing, it is necessary to interconnect a lead, in the case of a leaded device under test, or a pad, of a nonleaded device under test, to a corresponding trace on the load board. A test set or test socket having a plurality of contacts is interposed between the device under test and the load board in order to effectuate interconnection. A contact is engaged, at an upper end thereof, by the lead or pad of the DUT, depending upon the type of DUT being tested, with its corresponding trace on the load board. A lower end of the contact is in engagement with a trace on the load board.

As technology has progressed, the size, shape and electronic properties of contacts have evolved in response to the construction of test sets and load boards and the architecture of devices to be tested. At one time, it was considered necessary to have a wiping action at the various locations of engagement of the contact ends by the lead or pad of the DUT and the pad on the load board. Such wiping action was deemed to facilitate a good transmission path through the contact because of a good connection at either end thereof. It has become more apparent, however, that the measure of wiping action formerly considered necessary to maintain a good transmission path need not be of a degree as was formerly believed. Further, it has been recognized that excessive wiping action can damage component parts at the various points of engagement of the contact, and thereby significantly decrease the life of the test socket and tester load board. Consequently, various attempts have been made to minimize abrading of one surface relative to another. Various elastomeric mounting means have been devised in an effort to minimize abrasion and consequent deterioration of components.

Another problem which has been discovered is the diminishment of effectiveness of testing as a result of the employment of matte tin on leads and pads of various types of DUTs. Such a material is applied to DUT components which facilitate soldering to an ultimate host circuit board. Because of its softness, however, it easily can progressively become adhered to the contact which the DUT engages as rubbing across engaged surfaces occurs during the testing function. Eventually, matte tin can build up to the point where signal integrity through the contact can become diminished.

It is to these dictates and shortcomings of the prior art that the present invention is directed. The present invention is a contact having a structure which minimizes tin buildup on the contact.

SUMMARY OF THE INVENTION

The present invention is a contact for use in a test set mountable to a load board of a tester apparatus. The contact serves to electrically connect at least one lead of a device to be tested (DUT) with a corresponding metallic trace on the load board. The contact has a first end which defines multiple contact points engageable by the lead of the DUT. It further has a second end having an arcuate edge in engagement with the metallic trace. The arcuate edge enables rolling across the metallic trace when the first end of the contact is engaged by the lead of the DUT and made to rotate about an axis generally perpendicular to a plane defined by the contact. The contact is elastomerically mounted as part of the test set intermediate the load board and the DUT. Rotation of the contact about the axis when the first end of the contact is engaged by the lead of the DUT is thereby facilitated.

A test set employing the contact can utilize multiple contact points which take the form of a plurality of ridges. In one embodiment of the invention, the ridges are generally parallel to one another. Similarly, the ridges can be substantially parallel to the axis which is generally perpendicular to the plane defined by the contact.

By so structuring the contact, the contact will have ridges which are sequentially engageable by the lead of the DUT as the contact rotates about the axis from a first orientation, wherein the first end of the contact is initially engaged by the lead of the DUT, to a second orientation, wherein the contact is in a configuration for operational testing.

An inward-most ridge with respect to the test set is the only ridge which is engaged by the lead of the DUT when the contact is in its first orientation. Successively outward ridges are sequentially engaged as the contact is made to rotate about the axis from the first orientation to the second orientation.

The present invention is thus an improved test set structure and contact for use in such a test set. More specific features and advantages obtained in view of those features will become apparent with reference to the DETAILED DESCRIPTION OF THE INVENTION, appended claims and accompanying drawing figures.

DETAILED DESCRIPTION OF THE INVENTION

Figure 1:
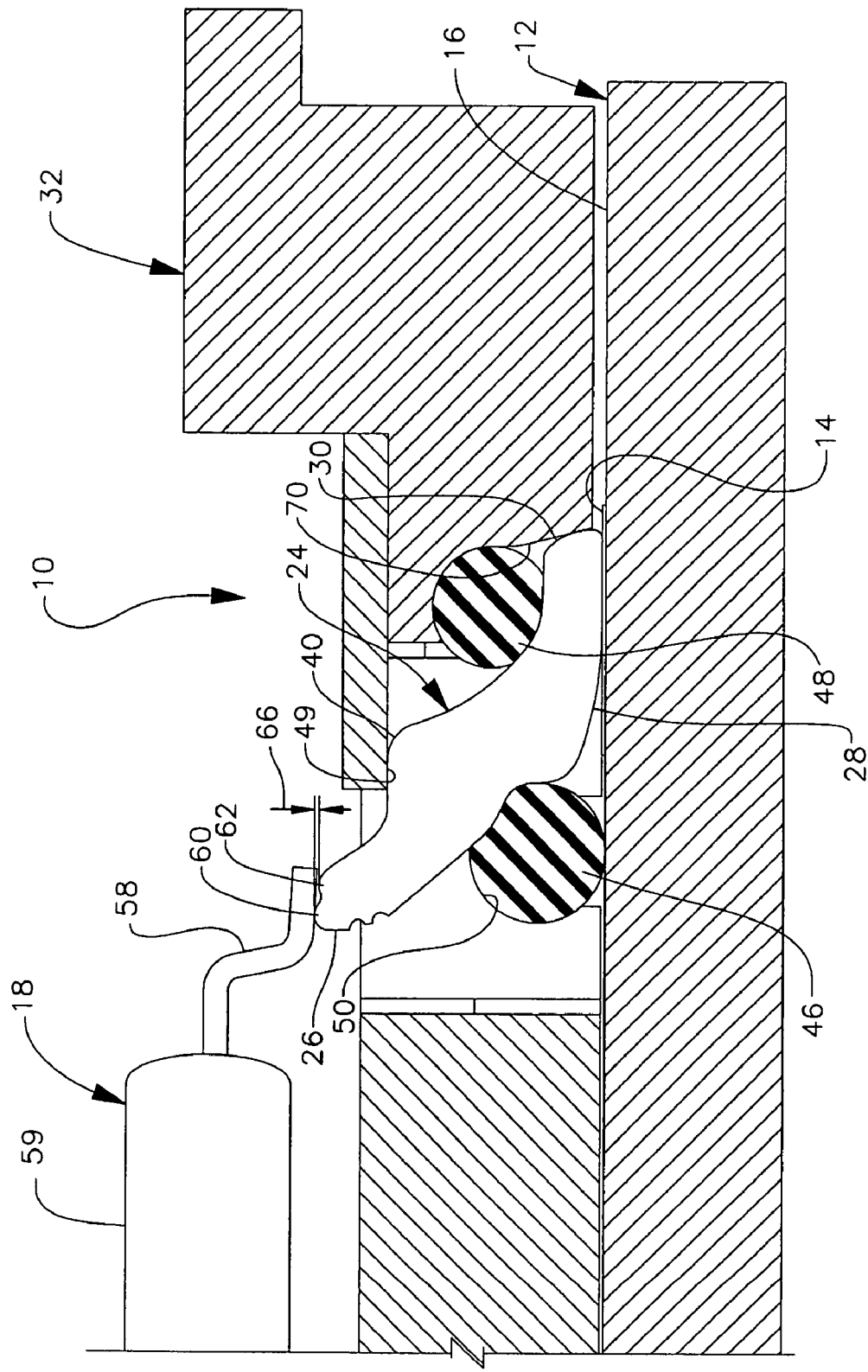
FIG. 1 is a side elevational view of a test set employing a contact in accordance with the present invention, some portions being shown in section.

Referring now to the drawing figures, wherein like reference numerals denote like elements throughout the several views, FIG. 1 illustrates a test socket 10 in accordance with the present invention. The test socket 10 is intended for use with a tester typically employed for ascertaining quality of integrated circuit devices used in electronic appliances. The tester interfaces with a tester load board 12 which has electrically conductive traces 14 formed on a surface 16 thereof to enable electronic communication between the tester and an integrated circuit device 18 to be tested. That is, electrical signals are transmitted between the device under test 18 and the test apparatus through the test socket 10.

Figure 2:
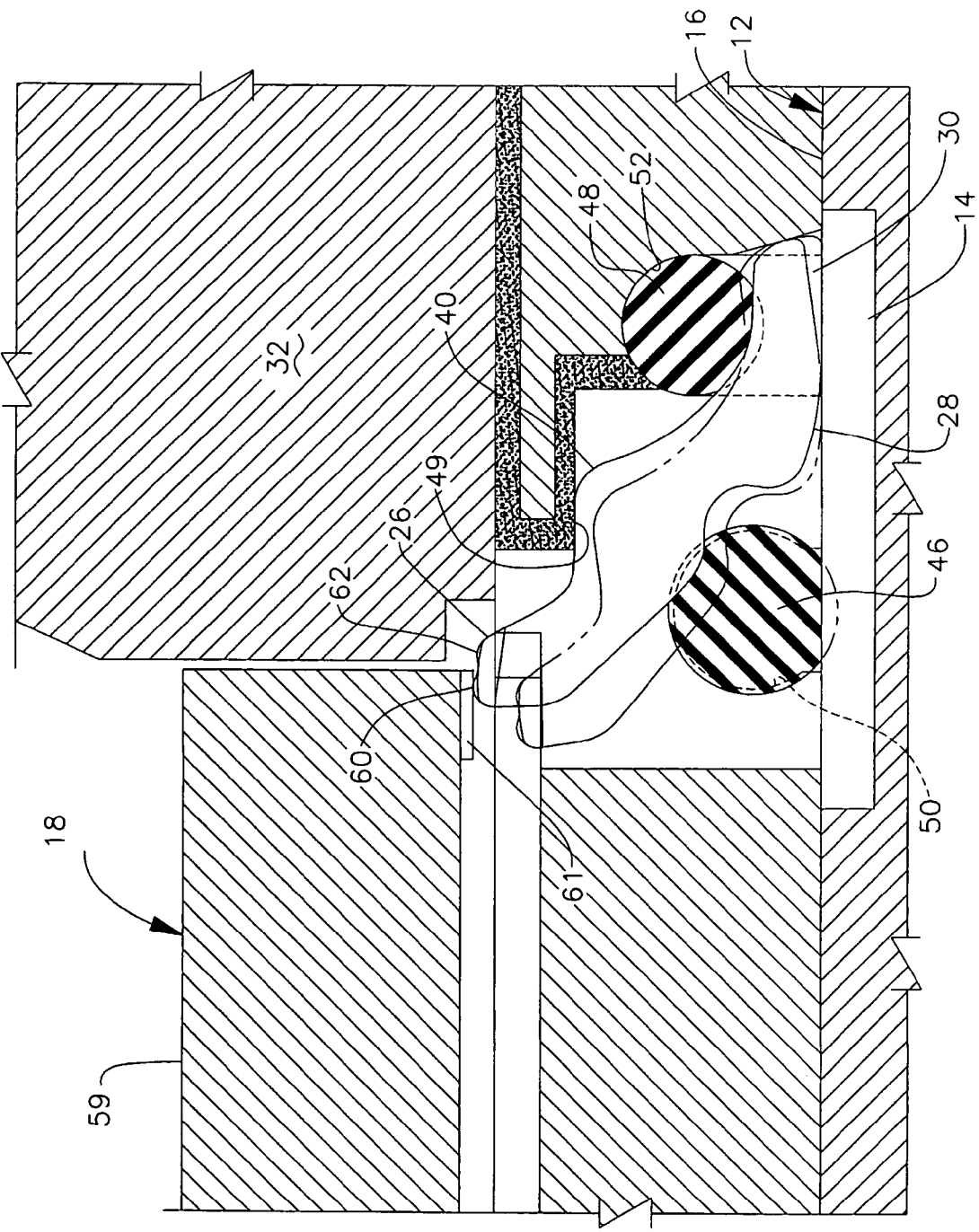
FIG. 2 is a view similar to FIG. 1 illustrating first and second orientations of the contact.

It will be understood that various types of integrated circuit devices 18 are able to be tested utilizing a test socket or test set in accordance with the present invention. FIG. 1 illustrates a leaded device having externally-extending leads 58 diverging from the body 59 of the device 18. It will be understood, however, that leadless devices, as illustrated in FIG. 2, can be accommodated. Such devices have pads 61 rather than leads 58.

While it is to be understood that FIG. 1 illustrates a device under test (DUT) package in an elevational view showing a single lead, a plurality of leads 58 are typically part of the device 18. In such cases, a contact 24, as will be discussed hereinafter, will be provided for engagement by each lead 58. It will be understood that substantially identical leads extend, in the case of the type of device 18 illustrated, along both of opposite sides of the device package 18.

In operation, downward pressure is brought to bear upon the body 59 of the device 18 by a plunger mechanism (not shown). As the plunger depresses the device 18 downward, contacts 24, which are mounted in an elastomeric fashion as will be discussed hereinafter, are caused to be rotated with respect to an axis which extends generally perpendicular to a plane defined by the contact 24. An axis with respect to which contact 24 might rotate is identified by reference numeral 68 in FIG. 3.

FIG. 1 illustrates a location of the device 18 and an orientation of contact 24 when lead 58 has first engaged the front, or inner, end 26 of contact 24. FIG. 2 illustrates an orientation of contact 24 (a second orientation) when the device is in a test position. It will be understood that, in view of the construction of contact 24 as will be discussed hereinafter, an arcuate surface 28 at the rear end 30 of contact 24 will roll across trace 14 on the load board 12 with virtually no translational or rotational sliding of that surface along the trace 14. FIGS. 1 and 2 illustrate a wall 70 against which rear end 30 of contact 24 abuts. Such a wall 70 is defined in the housing of the test socket 10. It will be noted that the wall 70 is at a rather large acute angle with respect to the surface 16 of load board 12. Typically the angle is somewhere within a range of between 72°-78°. The wall 70 serves to be engaged by rear end 30 of contact 24 in order to preclude sliding of edge 28 along trace 14.

The contact 24 illustrated in the drawing figures includes a protrusion 40. Protrusion 40 functions to engage, when mounted by elastomers 46-48, a shoulder 49 defined by the housing 32. Engagement of the shoulder 49 by protrusion 40 serves to limit the degree of upward movement of the contact 24 and the distance the front end 26 of the contact 24 will extend beyond an upper surface of the housing 32 when the contact 24 is not engaged by a device to be tested.

As previously discussed, elastomers 46, 48 affect mounting of contact 24. The test socket housing 32 is, therefore, provided with a pair of channels 50, 52 which extend along axes generally transverse to a plane defined by contact 24 when it is mounted in the housing 32. Elastomers 46, 48 are received within channels 50, 52 respectively. Rear elastomer 48 is pre-loaded and, as a result of the arcuate surface 28 at the rear end 30 of contact 24 being in engagement with the load board 12, will engage an upper edge of the rear end 30 of contact 24 at a location to urge the front end 26 of contact 24 upwardly. Similarly, front elastomer 46 is under compression and also serves to urge contact 24 upward. Contact 24 will, in its neutral orientation, be positioned and oriented as seen in FIG. 1. This is a first orientation of contact 24 and the one it occupies prior to a device 18 being brought into engagement with the upper end 26 of contact 24 by device 18.

Figure 3:
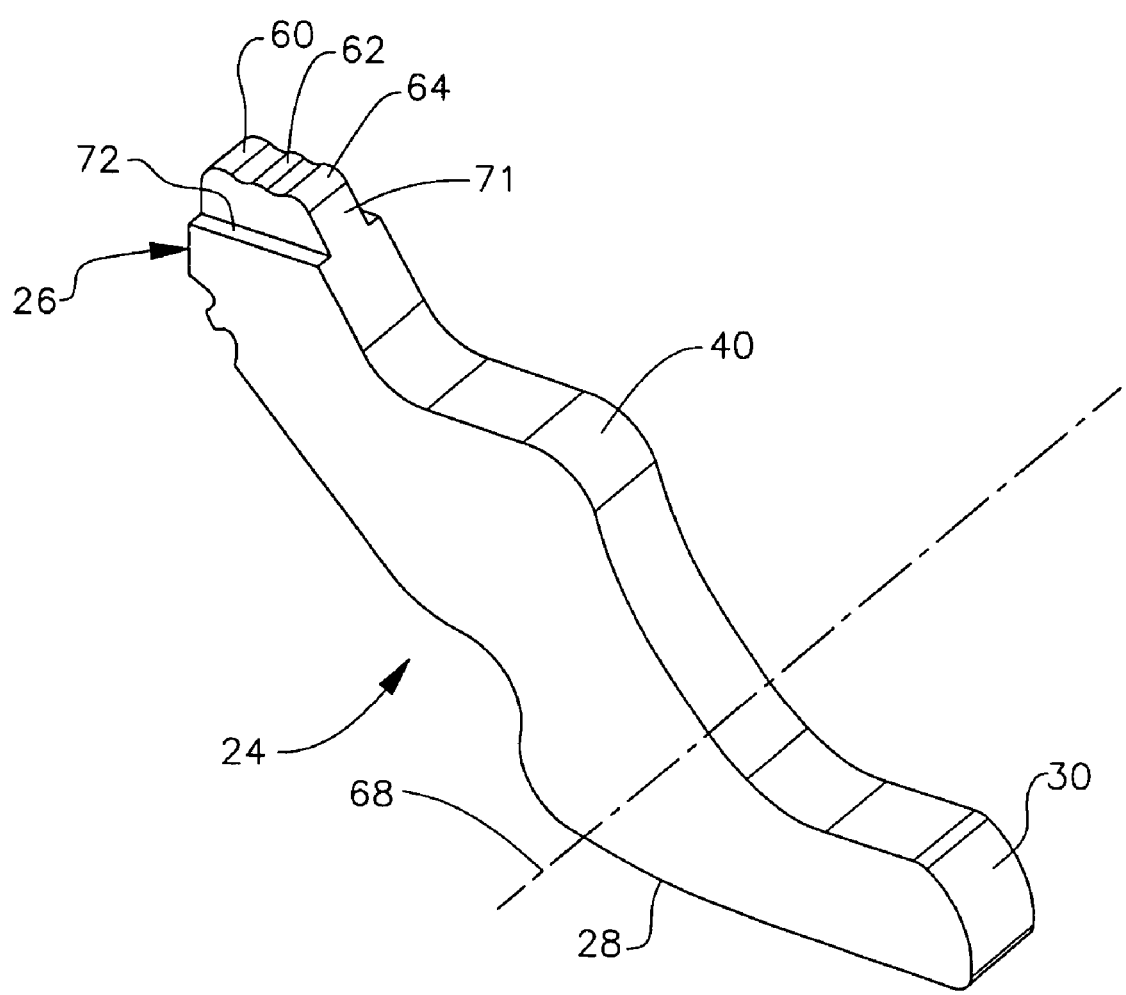
FIG. 3 is a perspective view of a contact in accordance with the present invention.

FIG. 1 illustrates multiple contact points defined by upper end 26 of contact 24. The contact points are, as best seen in FIG. 3, generally parallel extending ridges 60, 62, 64. While FIG. 3 illustrates three parallel ridges extending generally parallel to the axis 68, a smaller contact, as shown in FIGS. 1 and 2, might well be provided with only two ridges 60, 62.

FIG. 1 illustrates the locations of ridges 60, 62 relative to each other at the time of first engagement by lead 58 of device 18. It will be noted that ridge 60 is engaged by lead 58, and ridge 62 is not. The spacing between lead 58 and ridge 62, when the contact 24 is in this orientation, is illustrated by reference numeral 66.

As pressure continues to be applied to device 18, contact 24 will be caused to rotate generally counterclockwise about axis 68. At some point, lead 58 will engage ridge 62, and ridge 60 will be rotated downwardly away from lead 58. In the case of a three-ridge embodiment, second ridge 62 will also be withdrawn from lead 58 as third ridge 64 engages the lead.

It has been found that such a multiple contact point contact 24 is particularly effective in dealing with matte tin typically provided on lead 58 to facilitate soldering to an ultimate host board. The multiple ridge construction serves to help control a buildup of tin on front end 26 of contact 24. The first ridge 60 has a tendency to collect the most tin. A non-desirable buildup is deterred by providing multiple ridges. The first ridge serves a sacrificial function in absorbing the greatest transfer of tin.

FIG. 3 illustrates a contact 24 having a narrowed front end 26. Such an embodiment defines a smaller land 71 with spaced shoulders 72 on either side thereof. Such a feature, it is envisioned, would be used when the device being tested were leadless and had a pad generally flush with the bottom of the body of the device 18. Such a land embodiment could even serve to function in an environment wherein the pad or pads of the DUT are recessed within the body of the integrated circuit.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. A test set mounted to a load board of a tester apparatus to electrically connect at least one lead of a device to be tested (DUT) with a corresponding metallic trace on the load board, comprising:

a plurality of contacts mounted rotatably with respect to an axis which extends generally perpendicular to a plane defined by the contact, each contact having a first end defining multiple, arcuately spaced contact points, each for sequentially engaging a single lead of the DUT as the contact is made to rotate about said axis, and a second end having an arcuate edge in engagement with the metallic trace, rollable across the trace when said first end of said contact is engaged by the lead of the DUT and made to rotate about said axis;

means for elastomerically mounting said contact intermediate the load board and the DUT for rotation about said axis when said first end of said contact is engaged by the lead of the DUT;

wherein said multiple contact points comprise a plurality of ridges;

wherein said ridges are generally parallel to one another;

wherein said ridges are generally parallel to said axis; and wherein said ridges are sequentially engageable by the lead of the device as said contact rotates about said axis from a first orientation, wherein said first end of said contact is initially engaged by the lead of the DUT, to a second orientation, wherein said contact is in a test configuration.

2. A test set in accordance with claim 1 wherein only an inward-most ridge is engaged by the lead of the DUT when said contact is in said first orientation.

3. A test set in accordance with claim 2 wherein successively outward ridges are sequentially engaged as said contact rotates about said axis from said first orientation to said second orientation.

\* \* \* \* \*